July 7, 1970 A. WALTHER 3,519,798

DEVICE FOR THERMAL PROCESSING OF SEMICONDUCTOR WAFERS

Filed April 4, 1968 2 Sheets-Sheet 1

July 7, 1970 A. WALTHER 3,519,798

DEVICE FOR THERMAL PROCESSING OF SEMICONDUCTOR WAFERS

Filed April 4, 1968 2 Sheets-Sheet 2

United States Patent Office 3,519,798
Patented July 7, 1970

3,519,798
DEVICE FOR THERMAL PROCESSING OF SEMICONDUCTOR WAFERS

Albert Walther, Gartenberg, Germany, assignor to Siemens Aktiengesellschaft, Berlin, Germany, a corporation of Germany Filed Apr. 4, 1968, Ser. No. 718,879
Claims priority, application Germany, Apr. 7, 1967, S 109,235
Int. Cl. F27d *11/08*
U.S. Cl. 219—439 5 Claims

ABSTRACT OF THE DISCLOSURE

A device for thermal processing of disc shaped objects for use in semiconductors, particularly for epitactic precipitation of semiconductor material, wherein the discs being processed are arranged at the bottom of a treatment chamber and are heated from below to processing temperatures by an areally extending heating device with its upper surface parallel to the discs being treated. The device of the present invention is characterized by the fact that the planar bottom of the treatment vessel, comprised of silicon dioxide and having particularly a uniform wall thickness, is supported from below by at least one member in direct contact with the bottom and is comprised of more heat resistant material than $SiO_2$.

Epitaxy is frequently used for producing semiconductor components. This technique consists in heating discs or wafers of semiconductor crystals, particularly monocrystals, to a high temperature below the melting point of the semiconductor, while simultaneously passing a reaction gas across the discs. Semiconductor material, usually monocrystalline, thus precipitates upon the semiconductor discs. The semiconductor discs are heated mainly by electrical means, for example by maintaining the wafers during the precipitation process, in direct contact with a carrier and heater consisting of heat resisting, conducting material through which passes an electrical heating current. Alternatively, thew afers may contact an insulating intermediate layer which in turn contacts the carrier. Of course, other heating possibilities also exist. For many known reasons, the preferred reaction gas is a halogen or a halogen hydride of the element to be produced. This active component is preferably diluted with hydrogen, and possibly with an inert gas. Frequently, specific concentrations of dopants are also added.

The production of semiconductor components by epitaxy requires a high uniformity of the precipitated layers as to thickness and doping. One of the prerequisites necessary to achieve this requirement is an exceptionally uniform heating of the semiconductor discs being processed.

This problem was considered in patent application Ser. No. 718,881, filed on even date herewith. According to this copending application, the uniform heating is effected in a device for thermal processing of discs for semiconductor purposes wherein the discs to be processed are arranged at the bottom of a processing chamber and are heated to the proper processing temperature by a heating device located beneath the bottom of the chamber and extending areally with its upper surface parallel to the discs to be processed. A temperature adjusting device, i.e., a temperature adjustment plate, is arranged between the heating device and the bottom of the treatment vessel and extends at least in its center portion, parallel to the bottom of the treatment vessel. This plate is so constructed that the axial heat flow traversing the center portion of the temperature adjusting device, i.e., in the direction from the heating device toward the discs to be processed, encounters a stronger impedance in said center of the parallel portion of temperature adjusting device than at the edge, while the radial flow of heat in the temperature adjusting device (i.e., flowing outward from the inside) meets with an impedance, at least in some places.

The aforementioned measures ensure uniform heating of the semiconductor discs being treated. An important role is also played by a uniform supply of the processing gas which is passed to the disc surface being treated. This applies to epitaxy operations, i.e. devices wherein semiconductor material is precipitated in a monocrystalline state upon heated substrate discs, as well as to doping operations wherein semiconductor crystals are to be uniformly doped by a dopant gas, for example for producing surface regions of opposite conductance type.

A device serving the above-described purpose was described in my application Ser. No. 523,233, now Pat. No. 3,472,684, and application Ser. No. 515,304 of E. Sussman. These applications deal primarily with a particularly preferred embodiment for the supply and/or removal of gas in apparatus for coating semiconductor discs by means of epitaxy. Application Ser. No. 515,304 also considers features dealing with a uniform supply of gas as well as with uniform heating of substrate discs. For example, this application points out that heating the bottom of the reaction vessel, comprised of quartz, may result in the bottom sagging, particularly when the discs being epitactically coated are comprised of semiconductor materials with high operating temperatures, e.g., silicon, which results in irregularities in the temperature of the discs being coated, as well as in an irregular gas supply.

To eliminate these disadvantages, the Sussman application suggests to exert a gas pressure against the bottom of the quartz reaction vessel which carries the discs being coated, to compensate for the gas pressure prevailing in the reaction vessel and the weight of said bottom. This solution uses a sealed heating chamber which contains the areally extended heater and possibly also a temperature adjusting plate. An upper seal is formed directly by the bottom of the treatment vessel which carries the semiconductor discs being treated. This seal permits establishing a gas pressure in the heating chamber equal to the pressure in the reaction vessel. This gas pressure is established by maintaining an inert gas in the sealed-off chamber, thus preventing oxidation of the heating member and of the portion being heated.

The solution of the problem given in the above-mentioned application Ser. No. 515,304 is unsatisfactory in some respects. Particularly, the prevention of irregularities of the gas pressure in the heating chamber and in the treatment vessel can be effected only with great technical efforts and may result in the quartz bottom of the treatment vessel bulging upward. The results of an upwardly bulging bottom of the reaction vessel are that strong temperature fluctuations occur at the locality of the discs being treated, with disturbances in the gas flow conditions within the reaction chamber and, consequentially, fluctuating layers and/or doping thicknesses.

The present invention relates to a device for thermal processing of disc shaped objects for use in semiconductors, particularly for epitactic precipitation of semiconductor material, wherein the discs being processed are arranged at the bottom of a treatment chamber and are heated from below to processing temperatures by an areally extending heating device with its upper surface parallel to the discs being treated. The device of the present invention is characterized by the fact that the planar bottom of the treatment vessel, comprised of silicon dioxide and having particularly a uniform wall thickness, is supported from below by at least one member in direct contact with the bottom and is comprised of more heat resistant material than $SiO_2$. This supporting member is preferably developed as a temperature adjusting plate, thus obtaining the same properties which are described in concurrently filed patent application Ser. No. 718,881, based on German application S 109,236 IVc/12g.

Figure 1:
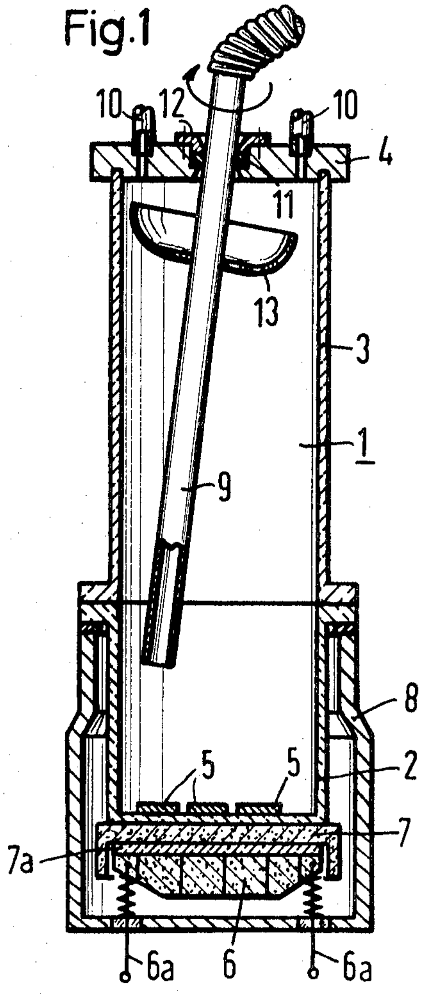
FIG. 1 shows an embodiment of a device according to the present invention.

While the device of FIG. 1 serves primarily for epitactic coating of semiconductor discs, it can however also be used for doping semiconductor discs from the gaseous phase or for producing alloyed-in electrodes on semiconductor discs.

In the apparatus of FIG. 1, a cylindrical reaction chamber 1 is formed by a pot- or cup-shaped bottom portion 2 and a cylindrical upper portion 3, both preferably consisting of quartz. It is recommended that all parts of the treatment vessel, which become strongly heated during the operational processes, be of an $SiO_2$ type with the highest possible absorption-free properties within a spectral region of 2.6 to 2.8$\mu$. The top of the reaction chamber is closed by a cover 4 of metal, such as stainless steel. The substrates 5 to be provided with epitaxial layers are placed flat upon the bottom of the pot-shaped lower portion 2. The discs are heated from below by means of an electrical heater element 6. The lower portion 2 of the reaction chamber 1, as well as the heating device 6, are preferably located in a cooled heating pot 8, consisting of metal, as had been described in copending patent application Ser. No. 515,304.

The supply of fresh reaction gas, as well as the removal of the exhausted reaction gas, are preferably effected from above. To this end, I provide a gas inlet 9, extending downwardly centrally through the metal cover 4. Positioned concentrically to the gas inlet are a plurality of escape openings for the gas 10. In the example, the gas inlet is movably positioned in the cover 4. At the same time a hermetic connection between the pipe 9 and the cover 4 is ensured. This is effected by a seal 11, comprised of chemical and heat resistant elastic material, which annularly encloses the pipe 9. In the example, said seal 11 is pressed, by a pressure ring 12, against an abutment in the cover 4 as well as against the inlet 9. The inlet pipe 9 may be moved from without the reaction vessel, in the sense of application Ser. No. 523,233. The gas inlet pipe 9 is enclosed within the reaction chamber, by a protective sleeve 13, which is turned upward in the shape of a cup, and is rigidly connected thereto. The sleeve serves as a radiation shield to protect the cover 4 from becoming too hot. Furthermore the sleeve catches any particles which form primarily on the cover 4 and act as impurity atoms, in cases where the device is used for epitactic purposes. As previously stated, the reaction chamber is preferably shaped as a circular cylinder. Finally, it is recommended, in order to keep the reaction gas pure that, in instances when the lower portion 2 and the upper portion 3 of the reaction vessel can be separated from one another, the gas supply pipe 9 should extend into the lower portion 2.

It can be easily understood that many possibilities are available to support the bottom of the reaction vessel, in the sense of the present invention. A springy support is generally preferred for mechanical reasons. The supporting member may, at the same time, carry out the function of a temperature adjusting plate and may be constructed in accordance with my application Ser. No. 718,881.

In the embodiment of FIG. 1, the plate shaped support member 7, comprised of graphite, for example, abuts with its upper surface against the bottom side of the reaction vessel 2. The plate shaped support member also acts as a temperature adjusting or equalizing plate. The supporting plate 7 itself is carried on spacer **7*a* comprised of beryllium oxide or another heat-resistant material resting on the planar surface of the heating device 6 which constitutes a meander or spiral shaped conductor made, for example, of carbon or graphite. The heating element itself is elastically supported, for example by electrode leads 6*a* of the heating device 6** which leads possess springly properties.

Figure 2:
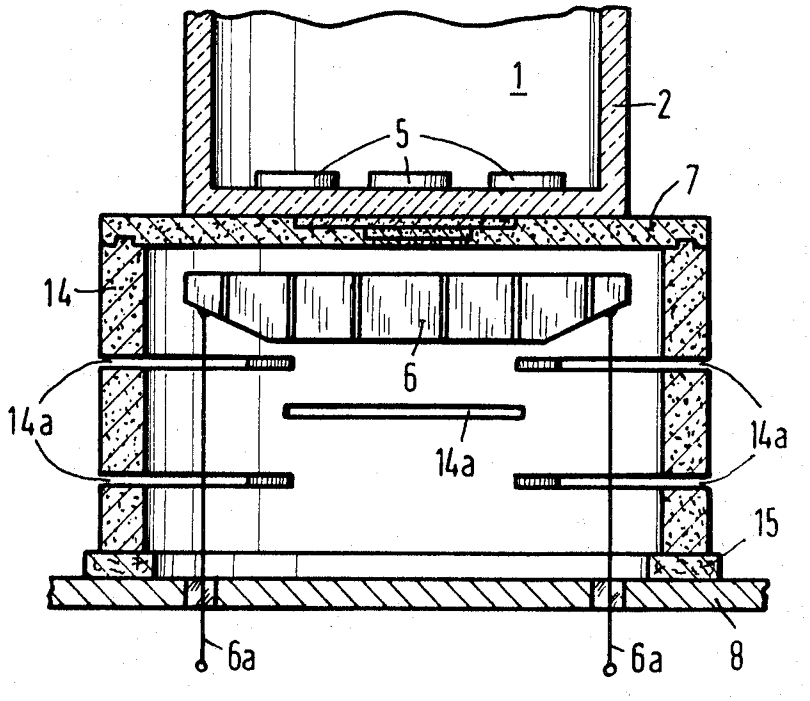
FIG. 2 shows those portions which are needed for heating and support and the bottom of the reaction vessel with supported semiconductor discs.

Another embodiment is shown in FIG. 2. The figure illustrates only those portions of the reaction vessel which are needed for heating and support as well as the bottom of the reaction vessel with the supported semiconductor discs. The reference numerals of the components which are also seen in FIG. 1 are the same as those used therein. The flat quartz bottom of the reaction vessel 2, with the semiconductor discs 5 carried at its interior wall, is supported from below by the abutting support plate 7. The support plate constitutes an upper seal of a springly body 14, preferably consisting of a hollow cylinder with horizontal grooves **14*a*. The lower edge of the support body rests on spacer 15, for example on the bottom of the heating pot 8. If, as is the case here, the bottom of the heating pot is cooled the spacers should have good heat insulating properties. The springy cylinder body 14 carrying support plate 7 is preferably comprised of graphite or carbon. The grooves 14*a* which provide the elastic qualities for the hollow graphite cylinder 14 run horizontally. In place of the above, the graphite cylinder 14** can be developed as a spiral split spring.

The support member 7 in FIG. 2 is developed in the sense of the embodiments of my above-mentioned copending application. Thus, said supporting member 7 has a recess opening for various graphite inserts, as more fully described in the above-mentioned application. In this instance, too, a complete abutment of the plate shaped support member against the lower portion of the bottom of the reaction vessel 2, is ensured.

Figure 3:
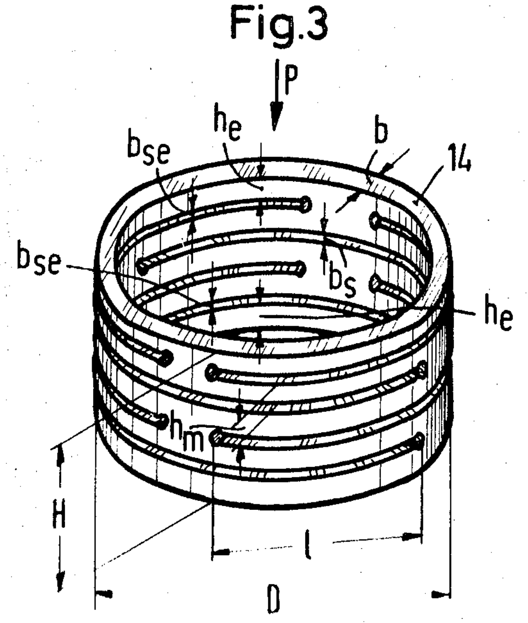
FIG. 3 shows a slit spring body for carrying the reaction vessel.

The dimensions of the support member 7 are a matter of convenience; however, the spring may be calculated. FIG. 3 shows the cylinder spring without the sealed cover 7, which is necessary, since the bottom 2 of the reaction vessel rests directly thereon. FIG. 3 illustrates only the slit spring body.

If one uses the construction illustrated in FIG. 2, the danger of a bending of the bottom of the reaction vessel in opposite direction, i.e., bulging upward, is largely eliminated. In the construction of FIG. 1 care must be taken, however, that the electrode leads developed as springs, do not exert upward forces which may overcompensate the balance.

With the aid of the present invention, it becomes possible to prevent either of the aforementioned bulges of the bottom of the reaction vessel with simple means, not requiring any special supervision during operation.

The following is an example for calculating the spring body **7*a*** in FIG. 2.

It is required for the spring member, with a given diameter D, to reduce its height H a distance S, under a given load P. The load P is uniformly divided over $2m$ "unit spring members," depending on magnitude (in the illustration $m=2$). The required spring pitch S is obtained through the number $n$ of the bending rods of a unit spring member.

By assuming that $D \gg b$, the following equation controls the dimensioning:

$$\frac{\sigma SE}{P^2}=\frac{3n \cdot l^4}{4m^2 \cdot 6^2 n^5 m} \quad (1)$$

wherein $\sigma$ is permissible bending stress of the spring material used in kp./cm.$^2$;

E is elastic modulus of the spring material in kp./cm.$^2$;
P is stress of the spring plus half of its self-weight in kp.;
S is pitch of spring required under load P in cm.;
$n$ is number of bending rods per unit spring element;
$2m$ is number of unit spring elements (even number);
$l$ is length of bending rods in cm.

The condition for Equation 1 is:

$$l \leqq \frac{D\pi}{2m} - h_m \cdot \sqrt[3]{20} \quad (2)$$

$b$ is the wall thickness of the spring wire in cm.;

$$b \leqq \frac{D}{10} \quad (3)$$

$h_m$ is the height of the bending rods in cm.;
$h_e$ are the end rods which limit the spring wire above and below.

Their through-bend should be negligible compared to that of $h_m$. Therefore:

$$h_e \geqq h_m \sqrt[3]{20} \quad (4)$$

$b_s$ is the width of the grooves between the bending rods in cm.

$$b_s = \frac{S}{n} \quad (5)$$

H is the height of the entire spring pipe:

$$H \geqq h_m(n + 2 \cdot \sqrt[3]{20}) + b_s(n+1) \quad (6)$$

The left side of Equation 1 constitutes a characteristic magnitude of the spring wire, which contains the determined conditions and requirements. The structural magnitudes $l$ and $b$ are limited by Equations 2 and 3. Magnitudes $n$, $m$ and $h_m$ may be selected as balancing magnitudes. Equations 4 to 6 supply the remaining structural magnitudes. The spring pipe may be protected against overexpansion, if the end groove width $b_{se}$ is chosen $$b_{se} = \frac{1}{2} b_s$$

I claim:

1. In apparatus for thermal processing semiconductor discs, wherein the discs are arranged at the bottom of a treatment chamber and are heated from below to processing temperature by an areally extending electric heating device whose upper surface is parallel to the discs being processed, said electric heating device having leads for electrically connecting said heating device with an electrical source of energy, a heating pot enclosing said electric heating device and the lower portion of the treatment chamber and structurally connects said electric heating device to said treatment chamber, the improvement which comprises a plate shaped support means consisting of heat-resistant material as a temperature adjusting plate fully supporting the bottom of the treatment chamber comprising $SiO_2$ and having a uniform wall thickness and said plate shaped support means being maintained in direct contact with said bottom and elastically supported by an elastic support means.

2. The apparatus of claim 1, wherein the elastic support means has spring qualities.

3. The apparatus of claim 1, wherein the plate shaped support means is carried via spacers of beryllium oxide upon the surface of an areally expanded heater which is held by elastic electrode leads.

4. The apparatus of claim 1, wherein the plate shaped support means forms the upper wall of a hollow cylinder whose wall obtains springy qualities from at least one groove.

5. The apparatus of claim 4, wherein the hollow cylinder is of graphite.

References Cited

UNITED STATES PATENTS

| | | | |
|---|---|---|---|
| 1,060,265 | 4/1913 | Lamb | 219—540 |
| 1,806,512 | 5/1931 | Wiegand | 219—540 X |
| 2,691,717 | 10/1954 | Huck | 219—462 |
| 2,933,586 | 4/1960 | Schusterius | 219—530 X |
| 3,293,074 | 12/1966 | Nickl | 117—201 |
| 3,381,114 | 4/1968 | Nakanuma | 118—49.5 X |

VOLODYMYR Y. MAYEWSKY, Primary Examiner

U.S. Cl. X.R.

165—185; 219—530, 540